(12) United States Patent
Gu et al.

(10) Patent No.: US 9,971,223 B2
(45) Date of Patent: May 15, 2018

(54) DISPLAY SUBSTRATE, DISPLAY APPARATUS HAVING THE SAME, AND FABRICATING METHOD THEREOF

(71) Applicant: BOE TECHNOLOGY GROUP CO., LTD., Beijing (CN)

(72) Inventors: Xin Gu, Beijing (CN); Juan Chen, Beijing (CN); Ning Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/501,847

(22) PCT Filed: May 20, 2016

(86) PCT No.: PCT/CN2016/082892
§ 371 (c)(1),
(2) Date: Feb. 5, 2017

(87) PCT Pub. No.: WO2017/032098
PCT Pub. Date: Mar. 2, 2017

(65) Prior Publication Data
US 2017/0351154 A1 Dec. 7, 2017

(30) Foreign Application Priority Data
Aug. 25, 2015 (CN) .......................... 2015 1 0527768

(51) Int. Cl.
*G02F 1/155* (2006.01)
*G02F 1/157* (2006.01)
*H01L 27/32* (2006.01)

(52) U.S. Cl.
CPC ............ *G02F 1/155* (2013.01); *G02F 1/157* (2013.01); *G02F 2001/1555* (2013.01); *G02F 2001/1557* (2013.01); *H01L 27/3258* (2013.01)

(58) Field of Classification Search
CPC . G02F 1/15; G02F 1/153; G02F 1/155; G02F 1/157; G02F 2001/1555; G02F 2001/1557; H01L 27/3258
(Continued)

(56) References Cited

U.S. PATENT DOCUMENTS 4,310,220 A * 1/1982 Kuwagaki ............. G02F 1/1523
359/267
2007/0097483 A1 5/2007 Park
(Continued)

FOREIGN PATENT DOCUMENTS

CN 202013465 U 10/2011
CN 103116239 A 5/2013
(Continued)

OTHER PUBLICATIONS

International Search Report & Written Opinion dated Jul. 26, 2016 regarding PCT/CN2016/082892.
(Continued)

*Primary Examiner* — William R Alexander
(74) *Attorney, Agent, or Firm* — Intellectual Valley Law, P.C.

(57) ABSTRACT

The present application discloses a method for fabricating a display substrate including forming an electrode layer comprising a plurality of electrode blocks on a base substrate; each electrode block corresponding to a subpixel region; and forming an electrochromic layer comprising a plurality of electrochromic blocks on the electrode layer by electrochemically depositing an electrochromic material onto the plurality of electrode blocks on a side of the electrode layer distal to the base substrate, each electrochromic block corresponding to each electrode block in a one-to-one relationship.

20 Claims, 3 Drawing Sheets

(58) Field of Classification Search
USPC .................................................. 359/266, 265
See application file for complete search history.

(56) References Cited

U.S. PATENT DOCUMENTS

| | | | | |
|---|---|---|---|---|
| 2008/0180781 A1* | 7/2008 | Varaprasad | ............. | B32B 17/06 359/267 |
| 2011/0199666 A1* | 8/2011 | Chun | ...................... | G02F 1/161 359/269 |
| 2012/0162744 A1 | 6/2012 | Lee et al. | | |
| 2013/0133814 A1* | 5/2013 | Shang | ..................... | B32B 38/00 156/182 |
| 2014/0362429 A1* | 12/2014 | Yokozeki | ............ | H01L 27/3232 359/267 |
| 2017/0168365 A1* | 6/2017 | Yu | ......................... | G02F 1/1521 |

FOREIGN PATENT DOCUMENTS

| | | |
|---|---|---|
| CN | 103323999 A | 9/2013 |
| CN | 103472648 A | 12/2013 |
| JP | 4689943 A | 6/2011 |
| TW | 200722886 A | 6/2007 |

OTHER PUBLICATIONS

First Office Action in the Chinese Patent Application No. 201510527768.9, dated Jul. 25, 2017; English translation attached.

* cited by examiner

300

540
530
520
510

DISPLAY SUBSTRATE, DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/082892 filed May 20, 2016, which claims priority to Chinese Patent Application No. 201510527768.9, filed Aug. 25, 2015, the contents of which are incorporated by reference in the entirety.

TECHNICAL FIELD

The present invention relates to display technology, more particularly, to a display substrate, display apparatus having the same, and a fabricating method thereof.

BACKGROUND

Electrochromic refers to a material (e.g., a compound, mixture of compounds, a solution, a composition, or a device) capable of undergoing a reversible change in electromagnetic absorption/transmittance when subjected to electrical stimulus. For example, the material may undergo an oxidative or a reductive transition upon the electrical stimulus, the reversible change may be a color change of the light transmitted from or reflected by the electrochromic material. Electrochromic materials have found a wide range of applications in various fields. Examples of such applications include a smart window and a rear view mirror for cars. A smart window is capable of automatically controlling light intensity and reducing thermal radiation. A rear view mirror is capable of automatically controlling the glitter from behind the car at night. Other exemplary applications of electrochromic material in display technology field includes a smart label and an electronic paper.

SUMMARY

In one aspect, the present invention provides a method for fabricating a display substrate comprising forming an electrode layer comprising a plurality of electrode blocks on a base substrate; each electrode block corresponding to a subpixel region; and forming an electrochromic layer comprising a plurality of electrochromic blocks on the electrode layer by electrochemically depositing an electrochromic material onto the plurality of electrode blocks on a side of the electrode layer distal to the base substrate, each electrochromic block corresponding to each electrode block in a one-to-one relationship.

Optionally, the electrode layer comprises the plurality of electrode blocks defined by an insulating matrix having a grid pattern on a conductive layer, the method comprises forming the conductive layer on the base substrate; forming the insulating matrix on a side of the conductive layer distal to the base substrate occupying an insulating region; and forming the electrochromic layer comprising the plurality of electrochromic blocks on a side of the conductive layer distal to the base substrate.

Optionally, the step of forming the electrochromic layer comprises applying a voltage to the conductive layer which is used as a working electrode.

Optionally, the step of forming the electrochromic layer comprises applying the voltage to the conductive layer in the presence of an electrochromic monomer material solution; electrochemically polymerizing the electrochromic monomer material into an electrochromic polymer material; and depositing the electrochromic polymer material onto the plurality of electrode blocks on a side of the conductive layer distal to the base substrate.

Optionally, the step of forming the insulating matrix comprising forming a black matrix using an insulating black material on a side of the conductive layer distal to the base substrate occupying a black matrix region; the black matrix having the grid pattern defining the plurality of electrode blocks.

Optionally, the method further comprises forming an ancillary insulating matrix on a side of the black matrix distal to the conductive layer, the ancillary insulating matrix substantially overlapping with the black matrix.

Optionally, the electrode layer is a pixel electrode layer comprising a plurality of pixel electrode blocks, the method comprises forming the electrochromic layer comprising the plurality of electrochromic blocks on a side of the pixel electrode layer distal to the base substrate.

Optionally, the step of forming the electrochromic layer comprises applying a voltage to the pixel electrode block.

Optionally, the step of forming an electrochromic layer comprises electrochemically depositing an electrochromic material on the pixel electrode block by applying the voltage to the pixel electrode block.

Optionally, the step of electrochemically depositing the electrochromic material comprises applying the voltage to the pixel electrode block in the presence of an electrochromic monomer material solution; electrochemically polymerizing the electrochromic monomer material into an electrochromic polymer material; and depositing the electrochromic polymer material onto the pixel electrode block.

In another aspect, the present invention provides a display substrate fabricated by a method described herein.

Optionally, the electrode layer comprises the plurality of electrode blocks defined by an insulating matrix having a grid pattern on a conductive layer, the insulating matrix is a black matrix made of an insulating black material.

Optionally, the display substrate further comprises an ancillary insulating matrix on a side of the black matrix distal to the conductive layer, the ancillary insulating matrix substantially overlapping with the black matrix.

Optionally, the display substrate further comprises a spacer layer on a side of the insulating matrix distal to the conductive layer.

In another aspect, the present invention provides a method of fabricating a display apparatus comprising fabricating a first display substrate by a method as described herein, and assembling the first display substrate with a second display substrate.

Optionally, the method further comprises applying a sealant to one of the first display substrate and the second display substrate; adhering the first display substrate and the second display substrate by the sealant, and forming a sealant layer between the first display substrate and the second display substrate; the sealant layer comprises an inlet; injecting an electrolyte solution between the first display substrate and the second display substrate through the inlet; and sealing the inlet.

Optionally, the method further comprises forming an ion storage layer on the second display substrate.

In another aspect, the present invention provides a display apparatus comprising a first display substrate and a second display substrate. The first display substrate is a display substrate fabricated by a method described herein.

Optionally, the display apparatus further comprises an electrolyte layer comprising an electrolyte solution between the first display substrate and the second display substrate.

Optionally, the display apparatus further comprises an ion storage layer on the second display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
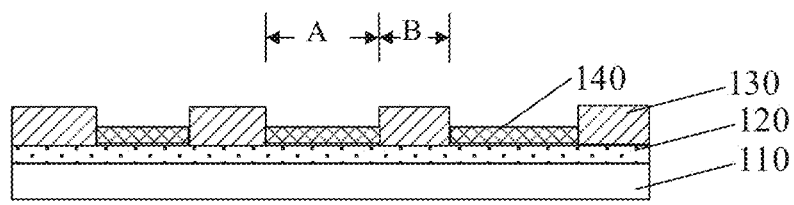
FIG. 1 is a diagram illustrating the structure of a display substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The conventional method of fabricating electrochromic devices (e.g., active matrix electrochromic devices) involves forming partition walls on the substrate to isolate electrochromic materials in each subpixel region from each other. The electrochromic materials are printed on the substrate. Thus, the fabricating process is highly complicated and the manufacturing costs high.

The present disclosure provides a superior electrochromic display substrate and electrochromic display apparatus that can be fabricated easily and cost-effectively. In one aspect, the present disclosure provides a display substrate having an electrode layer including a plurality of electrode blocks on a base substrate, each electrode block corresponding to a subpixel region; and an electrochromic layer including a plurality of electrochromic blocks; each electrochromic block on a side of an electrode block distal to the base substrate, each electrochromic block corresponding to each electrode block in a one-to-one relationship.

In some embodiments, the display substrate is a package substrate in a display apparatus. In some embodiments, the display substrate includes a base substrate; a conductive layer on the base substrate; an insulating matrix on a side of the conductive layer distal to the base substrate occupying an insulating region; the insulating matrix having a grid pattern defining a plurality of first regions, each first region corresponding to a subpixel region; the insulating region outside the plurality of first regions; and an electrochromic layer on a side of the conductive layer distal to the base substrate; the electrochromic layer comprising a plurality of electrochromic blocks, each electrochromic block in each first region corresponding to a subpixel region. For example, the insulating matrix includes a plurality of rows and a plurality of columns intersecting each other, dividing the display substrate into a plurality of first regions. Each first region corresponds to a subpixel region. Optionally, the insulating matrix is a black matrix with respect to a plurality of subpixels. Optionally, the display substrate further includes an ancillary insulating matrix on a side of the insulating matrix distal to the conductive layer. Optionally, the ancillary insulating matrix substantially overlapping with the insulating matrix.

In some embodiments, the display substrate is an array substrate in a display apparatus. In some embodiments, the display substrate has an array of a plurality of thin film transistors, a pixel electrode layer having a plurality of pixel electrodes, and a plurality of display signal lines on a base substrate, each thin film transistors electrically connected to each pixel electrode and each display signal line; and an electrochromic layer on a side of a pixel electrode layer distal to the base substrate. Optionally, each pixel electrode has four side surfaces connected to a top surface and a bottom surface, the top surface proximal to the electrochromic layer, the bottom surface proximal to the base substrate. Optionally, at least one side surface (e.g., 1, 2, or all) is in contact with the electrolyte layer. Optionally, the electrolyte layer is an electrolyte solution.

In another aspect, the present disclosure further provides a method of fabricating a display substrate described herein and a display apparatus having the same. In some embodiments, the method includes forming an electrode layer comprising a plurality of electrode blocks; each electrode block corresponding to a subpixel region; and forming an electrochromic layer comprising a plurality of electrochromic blocks on the electrode layer by electrochemically depositing an electrochromic material onto the plurality of electrode blocks on a side of the electrode layer distal to the base substrate, each electrochromic block corresponding to each electrode block in a one-to-one relationship. For example, the electrode layer may be an electrode layer including a plurality of electrode blocks defined by an insulating matrix (e.g., an insulating black matrix) having a grid pattern on a conductive layer (e.g., an integral common electrode). Optionally, the electrode layer may be a pixel electrode layer comprising a plurality of pixel electrode blocks.

In some embodiments, the step of forming the electrode layer includes forming a plurality of electrode blocks defined by an insulating matrix having a grid pattern on a conductive layer. Optionally, the method includes forming the conductive layer on a base substrate; forming the insulating matrix on a side of the conductive layer distal to the base substrate occupying an insulating region; and forming the electrochromic layer comprising the plurality of electrochromic blocks on a side of the conductive layer distal to the base substrate. Optionally, the step of forming the electrochromic layer includes applying a voltage to the conductive layer which is used as a working electrode; and electrochemically depositing an electrochromic material onto the plurality of electrode blocks on a side of the conductive layer distal to the base substrate. For example, the step of electrochemically depositing an electrochromic material includes applying a voltage to the conductive layer in the presence of an electrochromic monomer material solution, electrochemically polymerizing the electrochromic monomer material into an electrochromic polymer material, and depositing the electrochromic polymer material onto the plurality of electrode blocks on a side of the conductive layer distal to the base substrate.

In the present method, an electrochromic layer is formed by electrochemically depositing an electrochromic material onto the electrode blocks which corresponding to the subpixel regions by applying a voltage to the conductive layer. As compared to the conventional method, the present method does not require a partition wall and/or an electrochromic material printing process. Rather, the method involves forming an insulating matrix outside the subpixel regions, and applying a voltage to the conductive layer to electrochemically deposit an electrochromic material onto each electrode block which corresponding to each subpixel region. Thus, the present method significantly simplifies the fabricating process and lowers the manufacturing costs.

In some embodiments, the step of forming the electrode layer includes forming a pixel electrode layer comprising a plurality of pixel electrode blocks. Optionally, the method includes forming an array of a plurality of thin film transistors, a pixel electrode layer comprising a plurality of pixel electrodes blocks, and a plurality of display signal lines on a base substrate; each thin film transistors electrically connected to each pixel electrode block and each display signal line; and forming an electrochromic layer comprising the plurality of electrochromic blocks on a side of the pixel electrode layer distal to the base substrate. Optionally, the step of forming the electrochromic layer includes applying a voltage to a pixel electrode through a display signal line electrically connected to the pixel electrode. Optionally, the step of forming an electrochromic layer includes electrochemically depositing an electrochromic material on the pixel electrode by applying the voltage to the pixel electrode block. For examples, the step of electrochemically depositing an electrochromic material includes applying a voltage to the pixel electrode block in the presence of an electrochromic monomer material solution, electrochemically polymerizing the electrochromic monomer material into an electrochromic polymer material, and depositing the electrochromic polymer material onto the pixel electrode block.

In the present method, an electrochromic layer is formed by electrochemically depositing an electrochromic material on the pixel electrode by applying a voltage to the pixel electrode block. As compared to the conventional method, the present method does not require a partition wall and/or an electrochromic material printing process, significantly simplifies the fabricating process and lowers the manufacturing costs.

Accordingly, the present disclosure also provides a method of fabricating a display apparatus by assembling a first display substrate and a second display substrate together. The first display substrate may be a display substrate described herein or fabricated by a method described herein. The second display substrate is a display substrate opposite to the first substrate. For example, when the first substrate is a package substrate described herein or fabricated by a method described herein, the second substrate may be an array substrate. Similarly, when the first substrate is an array substrate described herein or fabricated by a method described herein, the second substrate may be a package substrate.

In another aspect, the present disclosure provides a display substrate fabricated by a method for fabricating a display substrate described herein. In some embodiments, the display substrate is a display substrate fabricated by a method including forming an electrode layer comprising a plurality of electrode blocks on a base substrate; each electrode block corresponding to a subpixel region; and forming an electrochromic layer comprising a plurality of electrochromic blocks on the electrode layer by electrochemically depositing an electrochromic material onto the plurality of electrode blocks on a side of the electrode layer distal to the base substrate, each electrochromic block corresponding to each electrode block in a one-to-one relationship. Optionally, the electrode layer includes a plurality of electrode blocks defined by an insulating matrix having a grid pattern on a conductive layer, and the display substrate is a display substrate fabricated by a method including forming the conductive layer on a base substrate; forming the insulating matrix on a side of the conductive layer distal to the base substrate occupying an insulating region; and forming the electrochromic layer comprising the plurality of electrochromic blocks on a side of the conductive layer distal to the base substrate. Optionally, the electrode layer is a pixel electrode layer comprising a plurality of pixel electrode blocks, and the display substrate is a display substrate fabricated by a method including forming an array of a plurality of thin film transistors, the pixel electrode layer comprising the plurality of pixel electrode blocks, and a plurality of display signal lines on a base substrate; each thin film transistors electrically connected to each pixel electrode block and each display signal line; and forming the electrochromic layer comprising the plurality of electrochromic blocks on a side of the pixel electrode layer distal to the base substrate.

FIG. 1 is a diagram illustrating the structure of a display substrate in some embodiments. Referring to FIG. 1, the display substrate (e.g., a package substrate) in the embodiment includes a base substrate 110, a conductive layer 120 on the base substrate 110, an insulating matrix 130 on a side of the conductive layer 120 distal to the base substrate 110, and an electrochromic layer 140 on a side of the conductive layer 120 distal to the base substrate 110. The insulating matrix 130 occupies an insulating region B. The insulating matrix 130 has a grid pattern defining a plurality of first regions A, each first region A corresponding to a subpixel region. The plurality of first regions A are outside the insulating region B.

Figure 2:
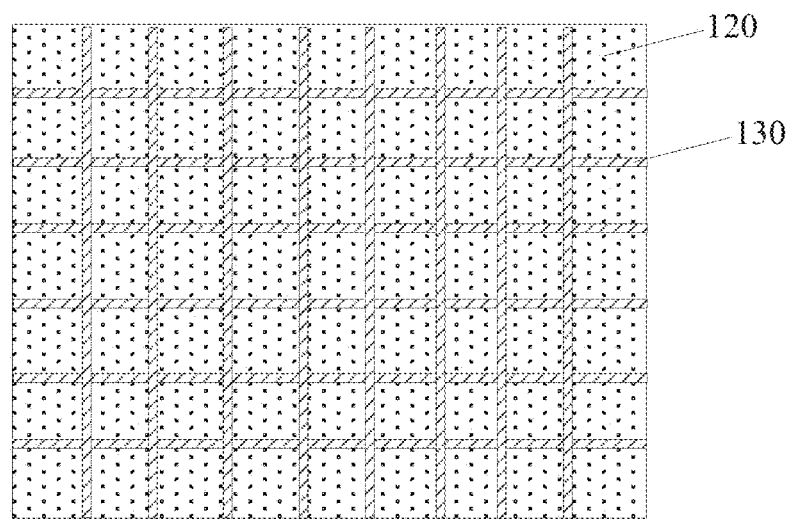
FIG. 2 is a diagram illustrating the structure of a display substrate prior to electrochemical deposition of the electrochromic material in some embodiments.
Figure 3:
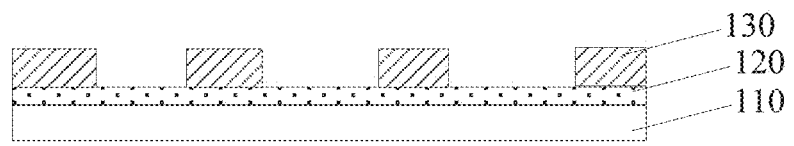
FIG. 3 is a diagram illustrating the structure of a display substrate prior to electrochemical deposition of the electrochromic material in some embodiments.
Figure 4:
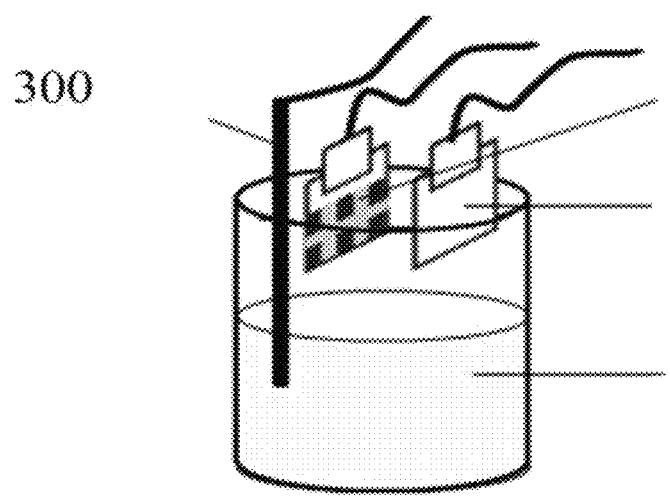
FIG. 4 is a diagram illustrating the process of electrochemical deposition of the electrochromic material in some embodiments.

The present disclosure provides a method of fabricating a display substrate. FIGS. 2-3 are diagrams illustrating the structure of a display substrate prior to electrochemical deposition of the electrochromic material in some embodiments. FIG. 4 is a diagram illustrating the process of electrochemical deposition of the electrochromic material in some embodiments. Referring to FIGS. 2-4, the method in some embodiments includes forming (e.g., depositing) a conductive layer 120 on a base substrate 110; and forming an insulating matrix 130 on a side of the conductive layer 120 distal to the base substrate 110. The insulating matrix 130 occupies an insulating region B. The insulating matrix 130 has a grid pattern defining a plurality of first regions A, each first region A corresponding to a subpixel region. The plurality of first regions A are outside the insulating region B. For example, the insulating matrix 130 includes a plurality of rows and a plurality of columns intersecting each other, dividing the display substrate into a plurality of first regions A. Each first region A corresponds to a subpixel region. As shown in FIGS. 2 and 3, the display substrate, after the above-mentioned two steps, includes a base substrate 110, a conductive layer 120 on the base substrate 110, and an insulating matrix 130 on a side of the conductive layer 120 distal to the base substrate 110.

Subsequently, the method in the embodiment further includes forming an electrochromic layer 140 on a side of the conductive layer 120 distal to the base substrate 110. The electrochromic layer 140 includes a plurality of electrochromic blocks. Each electrochromic block in each first region corresponds to a subpixel region. Specifically, the step of forming the electrochromic layer 140 may include applying a voltage to the conductive layer in the presence of an electrochromic material solution (e.g., in a deposition solution chamber); and electrochemically depositing an electrochromic material onto the plurality of first regions on a side of the conductive layer distal to the base substrate. The conductive layer is used as a working electrode (FIG. 4). The electrochromic material is electrochemically deposited into each first region defined by the insulating matrix 130 (e.g., by the rows and columns of the insulating matrix 130). The structure of a display substrate after this step in some embodiments is shown in FIG. 1. As compared to the structures illustrated in FIGS. 2 and 3, the display substrate in FIG. 1 includes an electrochromic layer 140 within the first region A (corresponding to a subpixel region) on a side of the conductive layer 120 distal to the base substrate 110. As shown in FIG. 1, the electrochromic layer 140 includes a plurality of electrochromic blocks, each of which corresponds to each first region A having a size corresponding to the size of a subpixel.

The method in the embodiment uses the conductive layer 120 as a working electrode, and uses the insulating matrix 130 for isolating each electrochromic block. The deposition of the electrochromic material is substantially limited to the first region A. When tested by applying a same pixel voltage to two adjacent subpixels in a display apparatus having the display substrate in the embodiment (e.g., for applying a voltage for a duration of 5-10 minutes, repeated twice), it was found that cross-talk between the two adjacent subpixels does not occur in the display apparatus. Thus, the present method avoids complicated partition wall implementation and the ink-jet printing process for depositing the electrochromic layer, greatly simplifies fabricating process, resulting in a superior display substrate that eliminates the cross-talk between subpixels.

In some embodiments, the conductive layer is a common electrode layer. Optionally, the conductive layer (e.g., the common electrode layer) is made of a material comprising indium tin oxide. Optionally, the conductive layer has a thickness in the range of about 400 Å to about 1500 Å, e.g., about 1350 Å. An integral layer may be used as the conductive layer in the present method, patterning of the conductive layer is not required. The common electrode layer can be conveniently used as the conductive layer for depositing the electrochromic material. In subsequent steps, a voltage is applied to the common electrode layer (as a working electrode) for electrochemical deposition.

In some embodiments, the insulating matrix on the conductive layer may be a black matrix. By using the black matrix as the insulating matrix for electrochemical deposition, the present method further simplifies the fabricating process. Optionally, the step of forming the insulating matrix includes forming a black matrix within the insulating region (i.e., outside the subpixel region) on a side of the conductive layer distal to the base substrate using an insulating black material.

In some embodiments, in addition to the insulating matrix, the display substrate may further include an ancillary insulating matrix on top of the conductive layer and substantially overlapping with the insulating matrix. Optionally, the ancillary insulating matrix is made of an insulating material such as silicon nitride or silicon oxide. The ancillary insulating layer is disposed over and substantially overlaps with the insulating matrix, further shielding the electrical field from the conductive layer underneath the insulating matrix, preventing electrochemical deposition of the electrochromic material on the insulating region. Optionally, the method includes forming an ancillary insulating matrix within the insulating region (i.e., outside the subpixel region) on a side of the insulating matrix distal to the conductive layer.

Optionally, the method includes depositing an insulating black material layer on a side of the conductive layer distal to the base substrate, depositing an ancillary insulating material layer (e.g., a silicon nitride layer) on a side of the insulating black material layer distal to the conductive layer, and patterning the insulating black material layer and the ancillary insulating material layer in a single patterning process (e.g., using a single mask) thereby obtaining the insulating black matrix and the ancillary insulating matrix.

FIG. 4 is a diagram illustrating the process of electrochemical deposition of the electrochromic material in some embodiments. As shown in FIG. 4, a substrate 100A having a conductive layer and an insulating matrix is placed in an electrochromic material solution chamber 400. To electrochemically deposit the electrochromic material onto the first regions, different voltages are applied to the conductive layer, a counter electrode 200, and a reference electrode 300 (e.g., a silver electrode or a calomel electrode), respectively. Optionally, the counter electrode 200 is made of platinum.

In some embodiments, the electrochromic material solution in the solution chamber is an electrochromic monomer material solution. When the voltages are applied to the conductive layer, the counter electrode, and the reference electrode, the electrochromic monomer material inside the solution chamber are polymerized into an electrochromic polymer material. The electrochromic polymer material is deposited onto the first regions. Examples of the electrochromic monomer materials includes, but are not limited to, aniline monomers and thiophene monomers. Optionally, the electrochromic monomer material solution has a concentration of the electrochromic monomer in the range of about 0.05 M to about 5 M. Optionally, the electrolyte is a propylene carbonate solution containing lithium perchlorate. Optionally, the voltage applied to the conductive layer is in the range of about 1 V to about 5 V.

In some embodiments, the display substrate further includes a spacer layer for spacing apart top display substrate (e.g., a package substrate) from another display substrate (e.g., an array substrate). Optionally, the method further includes a spacer layer on a side of the insulating matrix distal to the conductive layer.

Various embodiments of electrodeposition may be practiced. Other than electrochemical deposition, any other electrodeposition methods may be utilized for depositing the electrochromic material on the first regions.

Figure 5:
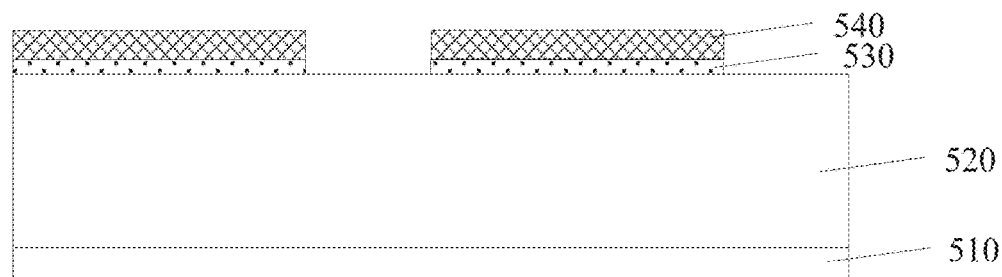
FIG. 5 is a diagram illustrating the structure of a display substrate in some embodiments.

In some embodiments, the method is directed to fabricating a display substrate such as an array substrate in a display apparatus. For example, the array substrate may be a substrate having a pixel electrode. FIG. 5 is a diagram illustrating the structure of a display substrate in some embodiments. Referring to FIG. 5, the display substrate in the embodiment includes a base substrate 510, an array of a plurality of thin film transistors on the base substrate 510, a passivation layer 520 on a side of the array of a plurality of thin film transistors distal to the base substrate 510, a pixel electrode layer having a plurality of pixel electrodes 530 on a side of the passivation layer 520 distal to the base substrate

510, a plurality of display signal lines on a side of the passivation layer 520 distal to the base substrate 510, and an electrochromic layer having a plurality of electrochromic blocks 540 on a side of a pixel electrode distal to the base substrate. Each thin film transistors is electrically connected to each pixel electrode 530 and each display signal line. As shown in FIG. 5, the display substrate does not contain a partition wall isolating electrochromic blocks 540 from each other.

In some embodiment, the method of fabricating a display substrate includes forming an array of a plurality of thin film transistors, a pixel electrode layer comprising a plurality of pixel electrodes, and a plurality of display signal lines on a base substrate; and forming an electrochromic layer on a side of a pixel electrode distal to the base substrate by applying a voltage to the pixel electrode through a display signal line electrically connected the pixel electrode. Each thin film transistors is electrically connected to each pixel electrode and each display signal line.

The method in the embodiment uses the pixel electrode 530 as a working electrode, obviating the need for a partition wall isolating electrochromic blocks corresponding to different subpixels from each other. The deposition of the electrochromic material is substantially limited to the pixel electrode, which corresponds to a subpixel region. When tested by applying a same pixel voltage to two adjacent subpixels in a display apparatus having the display substrate in the embodiment (e.g., for applying a voltage for a duration of 5-10 minutes, repeated twice), it was found that cross-talk between the two adjacent subpixels does not occur in the display apparatus. Thus, the present method avoids complicated partition wall implementation and the ink-jet printing process for depositing the electrochromic layer, greatly simplifies fabricating process, resulting in a superior display substrate that eliminates the cross-talk between subpixels.

In some embodiments, a substrate having an array of a plurality of thin film transistors, a pixel electrode layer, and a plurality of display signal lines on the substrate is placed in an electrochromic material solution chamber. Different voltages are applied to the pixel electrode (as a working electrode), a counter electrode, and a reference electrode (e.g., a silver electrode or a calomel electrode), respectively, to electrochemically deposit the electrochromic material onto the pixel electrodes. Optionally, the counter electrode 200 is made of platinum.

Optionally, a voltage is applied to a gate line to turn on the plurality of thin film transistors, a different voltage is applied to a data line which is connected to the plurality of pixel electrodes.

In some embodiments, the electrochromic material solution in the solution chamber is an electrochromic monomer material solution. When the voltages are applied to the display signal lines (e.g., the date line and the gate line), the electrochromic monomer material are polymerized inside the solution chamber into an electrochromic polymer material. The electrochromic polymer material is deposited onto the pixel electrodes. Examples of the electrochromic monomer materials includes, but are not limited to, aniline monomers and thiophene monomers. Optionally, the electrochromic monomer material solution has a concentration of the electrochromic monomer in the range of about 0.05 M to about 5 M. Optionally, the electrolyte is a propylene carbonate solution containing lithium perchlorate. Optionally, the voltage applied to the conductive layer is in the range of about 1 V to about 5 V.

In another aspect, the present disclosure provides a method of fabricating a display apparatus. In some embodiments, the method includes assembling a first display substrate with a second display substrate. Optionally, the first display substrate is a display substrate described herein or fabricated by a method described herein. The second substrate is a substrate opposite to the first substrate. For example, when the first substrate is a package substrate described herein or fabricated by a method described herein, the second substrate may be an array substrate. Similarly, when the first substrate is an array substrate described herein or fabricated by a method described herein, the second substrate may be a package substrate.

The present method uses the pixel electrode or the conductive layer as a working electrode, obviating the need for a partition wall isolating electrochromic blocks corresponding to different subpixels from each other. The deposition of the electrochromic material is substantially limited to the insulating region (i.e., outside the subpixel regions). As compared to the conventional method, the present method avoids complicated partition wall implementation and the ink-jet printing process for depositing the electrochromic layer, greatly simplifies fabricating process, resulting in a superior display substrate that eliminates the cross-talk between subpixels.

In some embodiments, the step of assembling the first display substrate and the second display substrate includes applying a sealant to the first display substrate and the second display substrate; adhering the first display substrate and the second display substrate by the sealant thereby forming a sealant layer between the first display substrate and the second display substrate, the sealant layer having an inlet; injecting an electrolyte solution between the first display substrate and the second display substrate through the inlet; and sealing the inlet.

Optionally, the electrolyte solution is injected between the first display substrate and the second display substrate through the inlet under vacuum, e.g., a vacuum in the range of about 3 to about 40 Pa.

Optionally, the electrolyte is a propylene carbonate solution containing lithium perchlorate. Optionally, the solution has a propylene carbonate concentration of about 1 M. Optionally, the solution has a lithium perchlorate concentration of about 99.9%.

In some embodiments, prior to assembling the first display substrate and the second display substrate, the method includes forming a spacer layer on one of the first display substrate and the second display substrate, e.g., by spraying a spacer material on one of the first display substrate and the second display substrate. For example, the spacer material may be sprayed onto the second display substrate when the method involved sealing the first display substrate onto the second display substrate. Alternatively, and the spacer material may be sprayed onto the first display substrate when the method involved sealing the second display substrate onto the first display substrate. Optionally, a spacer layer is pre-formed on either one of the display substrates, in which case it is not required to spray the spacer material onto the display substrates.

In some embodiments, the method further includes forming an ion storage layer on the display substrate not having the electrochromic layer (e.g., the second display substrate). Optionally, the ion storage layer is formed by spin coating a layer containing $V_2O_5$ or $TiO_2$. Optionally, the speed of the spin coating is in the range of about 100 rpm to about 6000 rpm. Optionally, the ion storage layer has a thickness in the range of about 10 nm to about 100 nm, e.g., about 20 nm.

In another aspect, the present disclosure provides a display apparatus comprising a first display substrate and a second display substrate. Optionally, the first display substrate is a display substrate described herein or fabricated by a method described herein. The second substrate is a substrate opposite to the first substrate. In the present display apparatus, each electrochromic block in the electrochromic layer corresponds to a single subpixel. The present display apparatus does not require a partition wall for isolating electrochromic blocks, thus can be fabricated in a simplified process.

Optionally, the display apparatus further includes an ion storage layer on a display substrate not having the electrochromic layer (e.g., the second display substrate).

Figure 6:
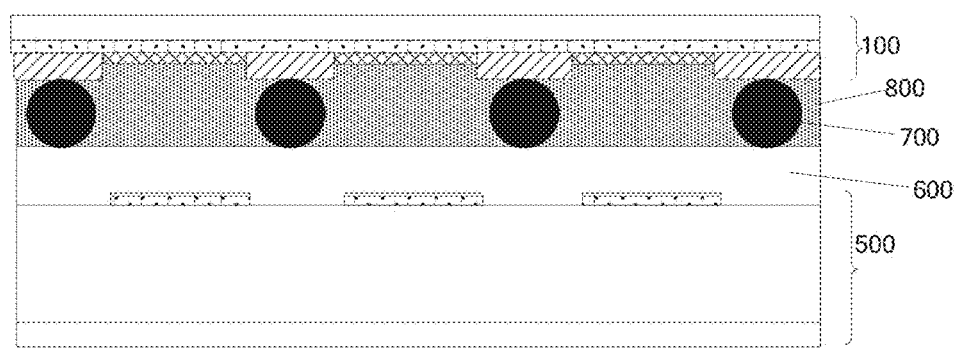
FIG. 6 is a diagram illustrating the structure of a display apparatus in some embodiments.

FIG. 6 is a diagram illustrating the structure of a display apparatus in some embodiments. Referring to FIG. 6, the display apparatus in the embodiment includes a first display substrate 100 and a second display substrate 500. For example, the first display substrate 100 may be a display as shown in FIG. 3, the second display substrate 500 may include an ion storage layer 600 (e.g., the substrate not having the electrochromic layer). The display apparatus in the embodiment also includes a spacer layer 700, spacing apart the first display substrate 100 and a second display substrate 500. The display apparatus in the embodiment further includes an electrolyte solution 800 between the first display substrate 100 and the second display substrate 500.

Figure 7:
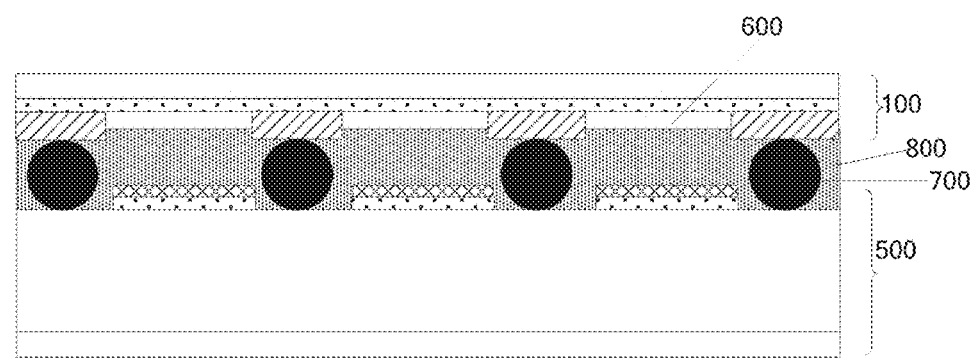
FIG. 7 is a diagram illustrating the structure of a display apparatus in some embodiments.

FIG. 7 is a diagram illustrating the structure of a display apparatus in some embodiments. Referring to FIG. 7, the display apparatus in the embodiment includes a first display substrate 100 and a second display substrate 500. For example, the second display substrate 500 may be a display as shown in FIG. 5, the first display substrate 100 may include an ion storage layer 600 on its lower surface (e.g., the substrate not having the electrochromic layer). The display apparatus in the embodiment also includes a spacer layer 700, spacing apart the first display substrate 100 and a second display substrate 500. The display apparatus in the embodiment further includes an electrolyte solution 800 between the first display substrate 100 and the second display substrate 500.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc., following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating a display substrate, comprising:
   forming an electrode layer comprising a plurality of electrode blocks on a base substrate; each electrode block corresponding to a subpixel region; and
   forming an electrochromic layer comprising a plurality of electrochromic blocks on the electrode layer by electrochemically depositing an electrochromic material onto the plurality of electrode blocks on a side of the electrode layer distal to the base substrate;
   wherein forming the electrochromic layer comprises applying a voltage to the plurality of electrode blocks in presence of an electrochromic monomer material solution;
electrochemically polymerizing an electrochromic monomer material into an electrochromic polymer material; and depositing the electrochromic polymer material onto the plurality of electrode blocks.

2. The method of claim 1, further comprising an insulating matrix having a grid pattern on a conductive layer;
   wherein the plurality of electrode blocks are a plurality of exposed parts of the conductive layer defined by the grid pattern of the insulating matrix;
   wherein the method further comprising:
   forming the conductive layer on the base substrate; and
   forming the insulating matrix having the grid pattern on a side of the conductive layer distal to the base substrate thereby forming the plurality of electrode blocks defined by the grid pattern of the insulating matrix.

3. The method of claim 2, wherein forming the electrochromic layer comprises applying a voltage to the conductive layer which is used as a working electrode.

4. The method of claim 3, wherein forming the electrochromic layer comprises applying the voltage to the conductive layer in presence of the electrochromic monomer material solution; electrochemically polymerizing the electrochromic monomer material into the electrochromic polymer material; and depositing the electrochromic polymer material onto the plurality of exposed parts of the conductive layer defined by the grid pattern of the insulating matrix.

5. The method of claim 2, wherein forming the insulating matrix comprising forming a black matrix using an insulating black material on a side of the conductive layer distal to the base substrate, the black matrix having the grid pattern defining the plurality of electrode blocks.

6. The method of claim 5, further comprising forming an ancillary insulating matrix on a side of the black matrix distal to the conductive layer, an orthographic projection of the ancillary insulating matrix on the conductive layer substantially overlapping with an orthographic projection of the black matrix on the conductive layer.

7. The method of claim 1, wherein the electrode layer is a pixel electrode layer comprising a plurality of pixel electrode blocks, the method comprising:

forming the electrochromic layer comprising the plurality of electrochromic blocks on a side of the pixel electrode layer distal to the base substrate.

8. The method of claim 7, wherein forming the electrochromic layer comprises applying a voltage to the plurality of pixel electrode blocks.

9. The method of claim 8, wherein forming an electrochromic layer comprises electrochemically depositing an electrochromic material on the plurality of pixel electrode blocks by applying the voltage to the plurality of pixel electrode blocks.

10. The method of claim 9, wherein electrochemically depositing the electrochromic material comprises applying the voltage to the plurality of pixel electrode blocks in presence of the electrochromic monomer material solution; electrochemically polymerizing the electrochromic monomer material into the electrochromic polymer material; and depositing the electrochromic polymer material onto the plurality of pixel electrode blocks.

11. A display substrate fabricated by a method of claim 1.

12. The display substrate of claim 11, further comprising an insulating matrix having a grid pattern on a conductive layer; and
wherein the plurality of electrode blocks are a plurality of exposed parts of the conductive layer defined by the grid pattern of the insulating matrix, the insulating matrix is a black matrix made of an insulating black material.

13. The display substrate of claim 12, further comprising an ancillary insulating matrix on a side of the black matrix distal to the conductive layer, an orthographic projection of the ancillary insulating matrix on the conductive layer substantially overlapping with an orthographic projection of the black matrix on the conductive layer.

14. The display substrate of claim 12, further comprising a spacer layer on a side of the insulating matrix distal to the conductive layer.

15. A method of fabricating a display apparatus, comprising fabricating a first display substrate by the method of claim 1, and assembling the first display substrate with a second display substrate.

16. The method of claim 15, further comprising:
applying a sealant to one of the first display substrate and the second display substrate;
adhering the first display substrate and the second display substrate by the sealant, and forming a sealant layer between the first display substrate and the second display substrate;
the sealant layer comprises an inlet;
injecting an electrolyte solution between the first display substrate and the second display substrate through the inlet; and
sealing the inlet.

17. The method of claim 15, further comprising forming an ion storage layer on the second display substrate.

18. A display apparatus, comprising a first display substrate and a second display substrate, wherein the first display substrate is a display substrate fabricated by the method of claim 1.

19. The display apparatus of claim 18, further comprising an electrolyte layer comprising an electrolyte solution between the first display substrate and the second display substrate.

20. The display apparatus of claim 18, further comprising an ion storage layer on the second display substrate.

* * * * *